US008440524B2

(12) United States Patent
Fujiwara et al.

(10) Patent No.: US 8,440,524 B2
(45) Date of Patent: May 14, 2013

(54) SEMICONDUCTOR DEVICE MANUFACTURING METHOD

(75) Inventors: Hirokazu Fujiwara, Miyoshi (JP); Masaki Konishi, Toyota (JP); Jun Kawai, Anjo (JP); Takeo Yamamoto, Oobu (JP); Takeshi Endo, Toyota (JP); Takashi Katsuno, Nisshin (JP); Yukihiko Watanabe, Nagoya (JP); Narumasa Soejima, Seto (JP)

(73) Assignees: Toyota Jidosha Kabushiki Kaisha, Toyota-shi (JP); Denso Corporation, Kariya (JP)

( * ) Notice: Subject to any disclaimer, the term of this patent is extended or adjusted under 35 U.S.C. 154(b) by 0 days.

(21) Appl. No.: 13/030,790

(22) Filed: Feb. 18, 2011

(65) Prior Publication Data
US 2011/0207321 A1    Aug. 25, 2011

(30) Foreign Application Priority Data

Feb. 19, 2010    (JP) ................................. 2010-034595

(51) Int. Cl.
*H01L 21/00*    (2006.01)
(52) U.S. Cl.
USPC .......................................... 438/253; 438/931
(58) Field of Classification Search .......... 438/268–270, 438/928, 931, 239–242, 396–399
See application file for complete search history.

(56) References Cited

U.S. PATENT DOCUMENTS

| 5,612,232 | A   | * | 3/1997  | Thero et al. .................... 438/571 |
| 7,547,578 | B2  | * | 6/2009  | Agarwal et al. ................ 438/113 |
| 2001/0039105 | A1 | * | 11/2001 | Rupp et al. ..................... 438/571 |
| 2005/0104072 | A1 |   | 5/2005  | Slater, Jr. et al. |
| 2006/0183350 | A1 |   | 8/2006  | Kudo et al. |
| 2007/0066039 | A1 |   | 3/2007  | Agarwal et al. |
| 2009/0233418 | A1 |   | 9/2009  | Agarwal et al. |

FOREIGN PATENT DOCUMENTS

| JP | 2004-363168 A | 12/2004 |
| JP | 2007-534143 A | 11/2007 |
| JP | 2009-509339 A | 3/2009 |

* cited by examiner

*Primary Examiner* — Richard A. Booth
(74) *Attorney, Agent, or Firm* — Kenyon & Kenyon LLP

(57) ABSTRACT

A method for manufacturing a semiconductor device including a semiconductor substrate composed of silicon carbide, an upper surface electrode which contacts an upper surface of the substrate, and a lower surface electrode which contacts a lower surface of the substrate, the method including steps of: (a) forming an upper surface structure on the upper surface side of the substrate, and (b) forming a lower surface structure on the lower surface side of the substrate. The step (a) comprises steps of: (a1) depositing an upper surface electrode material layer on the upper surface of the substrate, the upper surface electrode material layer being a raw material layer of the upper surface electrode, and (a2) annealing the upper surface electrode material layer. The step (b) comprises steps of: (b1) depositing a lower surface electrode material layer on the lower surface of the substrate, the lower surface electrode material layer being a raw material layer of the lower surface electrode, and (b2) annealing the lower surface electrode material layer with a laser to make an ohmic contact between the lower surface electrode and the substrate.

15 Claims, 6 Drawing Sheets

FIG. 6

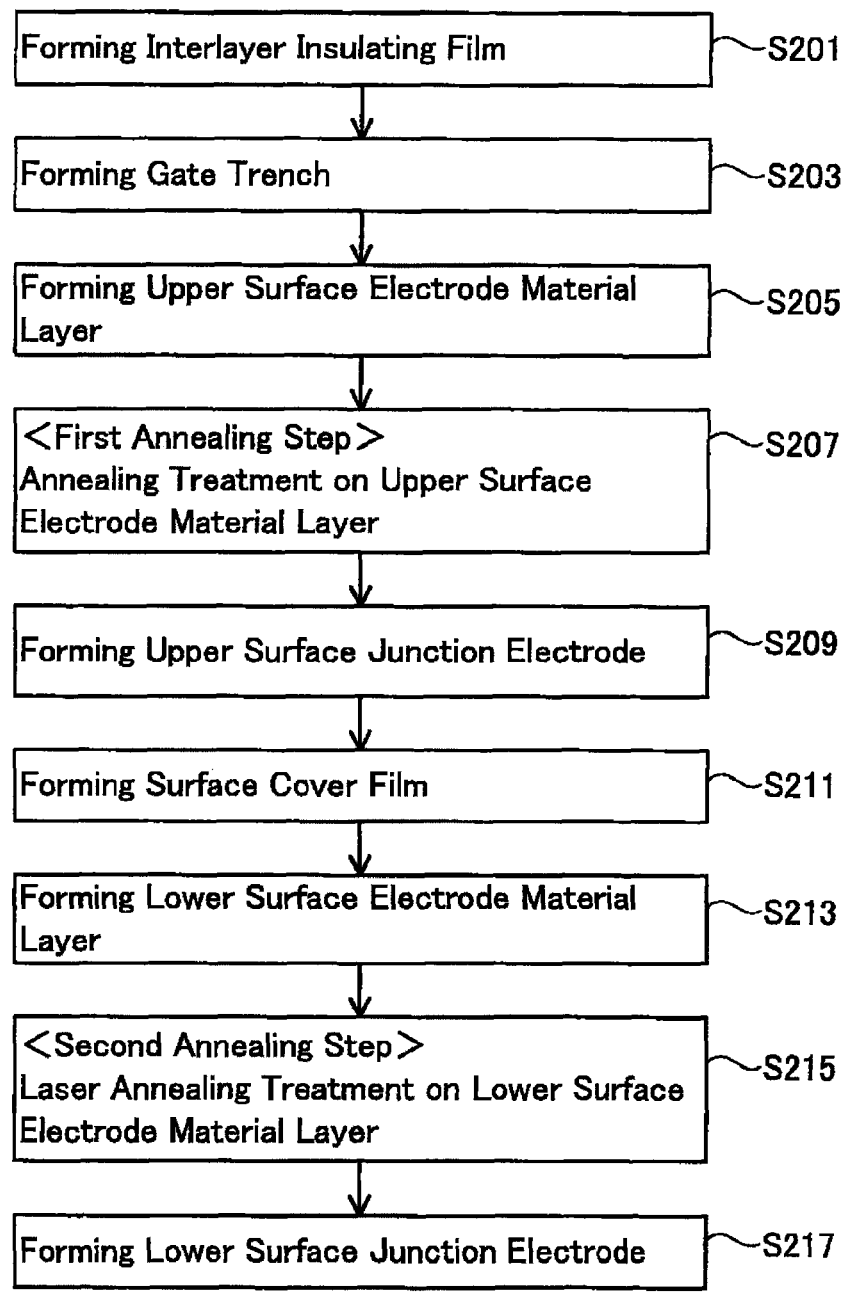

- Forming Interlayer Insulating Film — S201
- Forming Gate Trench — S203
- Forming Upper Surface Electrode Material Layer — S205
- \<First Annealing Step\> Annealing Treatment on Upper Surface Electrode Material Layer — S207
- Forming Upper Surface Junction Electrode — S209
- Forming Surface Cover Film — S211
- Forming Lower Surface Electrode Material Layer — S213
- \<Second Annealing Step\> Laser Annealing Treatment on Lower Surface Electrode Material Layer — S215
- Forming Lower Surface Junction Electrode — S217

SEMICONDUCTOR DEVICE MANUFACTURING METHOD

CROSS-REFERENCE TO RELATED APPLICATION

The disclosure of Japanese Patent Application No. 2009-258714 filed on Nov. 12, 2009, and Japanese Patent Application No. 2010-197685 filed on Sep. 3, 2010, including the specifications, drawings and abstracts, are incorporated herein by reference in their entirety.

TECHNICAL FIELD

The present application relates to a method for manufacturing a semiconductor device from a semiconductor wafer composed of silicon carbide.

DESCRIPTION OF RELATED ART

In a semiconductor device provided with a substrate having silicon carbide (SiC) as a material thereof (to be referred to as a silicon carbide semiconductor device), an electrode that forms a Schottky bather junction with the semiconductor substrate may be used for an upper surface electrode, while an electrode that makes an ohmic contact with the semiconductor substrate may be used for a lower surface electrode. In this case, temperature at which the lower surface electrode is heat-treated is higher than temperature at which the upper surface electrode is heat-treated in order to ensure the ohmic contact between the semiconductor substrate and the lower surface electrode.

For example, in a case of using nickel (Ni) for the material of the lower surface electrode, it is necessary to carry out the heat treatment at an ambient temperature of 900 to 1000° C. or higher in order to make the ohmic contact between the semiconductor substrate and the lower surface electrode. On the other hand, if the heat treatment is carried out at a high temperature on the upper surface electrode, it is no longer possible to form the Schottky barrier junction between the semiconductor substrate and the upper surface electrode, and since this causes an increase in leakage current, annealing treatment is generally carried out on the upper surface electrode at the ambient temperature of about 400° C. Consequently, in a case of a silicon carbide semiconductor device, a step of forming the lower surface electrode and carrying out the heat treatment therefor is carried out prior to a step of forming the upper surface electrode and carrying out the heat treatment therefor.

BRIEF SUMMARY OF THE INVENTION

In a semiconductor device manufacturing process, it is preferable to carry out a step of forming structures such as the lower surface electrode on the lower surface of the semiconductor device (to be referred to as a "lower surface structure formation step" hereinbelow) after first carrying out a step of forming structures such as the upper surface electrode on the upper side of the semiconductor device (to be referred to as an "upper surface structure formation step" hereinbelow). If the lower surface structure formation step is carried out prior to the upper surface structure formation step, a thinning step of thinning the semiconductor wafer, for example, must be carried out prior to the lower surface structure formation step. If the step of thinning the semiconductor wafer is carried out prior to the lower surface structure formation step and the upper surface structure formation step, the wafer that has been thinned must be transported in a subsequent step, thereby making the wafer increasingly susceptible to damage.

In addition, if the lower surface structure formation step is carried out prior to the upper surface structure formation step, this means that a lower surface electrode is formed prior to forming a surface cover film made of polyimide, for example, formed on the upper surface of the semiconductor device, thereby increasing susceptibility to contamination of the contact interface between the upper surface electrode and the semiconductor substrate.

An object of the present teachings is to realize both a protection of upper surface structures such as the upper surface electrode formed on the upper surface of the semiconductor device and a making the ohmic contact between the lower surface electrode and the semiconductor substrate by protecting upper surface structures such as the upper surface electrode formed on the upper surface of the semiconductor device even if the silicon carbide semiconductor device is manufactured by a manufacturing method in which the upper surface structure formation step is carried out prior to the lower surface structure formation step.

One aspect of the present teachings provides a method for manufacturing a semiconductor device including a semiconductor substrate composed of a silicon carbide, an upper surface electrode which contacts an upper surface of the substrate, and a lower surface electrode which contacts the lower surface of the substrate. This manufacturing method comprises steps of: (a) forming an upper surface structure on the upper surface side of the substrate, and (b) forming a lower surface structure on the lower surface side of the substrate after the step (a). The step (a) may comprise steps of: (a1) depositing an upper surface electrode material layer on the upper surface of the substrate, the upper surface electrode material layer being a raw material layer of the upper surface electrode, and (a2) annealing the upper surface electrode material layer. The step (b) may comprise steps of: (b1) depositing a lower surface electrode material layer on the lower surface of the substrate, the lower surface electrode material layer being a raw material layer of the lower surface electrode, and (b2) annealing the lower surface electrode material layer with a laser to make an ohmic contact between the lower surface electrode and the substrate.

In the above-mentioned manufacturing method, in the annealing step (b2) included in the step (b), the ohmic contact is made between the lower surface electrode material layer and the semiconductor substrate by irradiating the lower surface electrode material layer with laser. Since the laser radiation is used, the upper surface structures already formed on the upper surface of the semiconductor substrate are not subjected to damage by contamination and the like in the annealing step (b2). Consequently, if the step (b) that includes the annealing step (b2) is carried out after the step (a) that includes the annealing step (a2), the ohmic contact can be ensured between the lower surface electrode and the semiconductor substrate of the silicon carbide semiconductor device.

The present teachings may also provide a manufacturing apparatus capable of being used in the annealing step (b2) of the manufacturing method relating to the present teachings. This manufacturing apparatus may be provided with a source of a UV laser; a sealed box; a laser transmittable window composed of a UV laser transmittable materials, formed on a surface of the sealed box; a stage disposed in the sealed box for setting a semiconductor wafer; an optical system for guiding the UV laser from the source of the UV laser to the semiconductor wafer on the stage through the laser transmittable window; a gas induction line that induces gases into the sealed box, and a decompressor that decompresses the sealed box.

BRIEF DESCRIPTION OF DRAWINGS

FIG. 6 is a flow chart showing a semiconductor device manufacturing method relating to a second embodiment.

DETAILED DESCRIPTION

Figure 1:
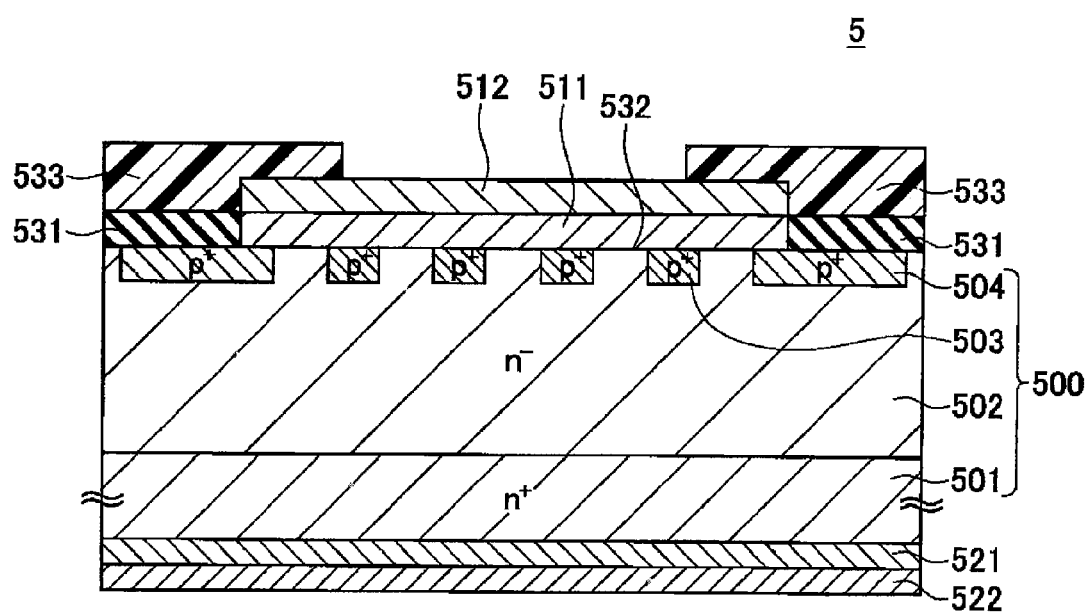
FIG. 1 is a cross-sectional view of a semiconductor device manufactured in a first embodiment.

One aspect of the present teachings provides a method for manufacturing a semiconductor device including a semiconductor substrate composed of a silicon carbide, an upper surface electrode which contacts an upper surface of the substrate, and a lower surface electrode which contacts the lower surface of the substrate. This manufacturing method has steps of (a) forming an upper surface structure on the upper surface side of the substrate, and (b) forming a lower surface structure on the lower surface side of the substrate after the step (a). The step (a) has steps of: (a1) depositing an upper surface electrode material layer on the upper surface of the substrate, the upper surface electrode material layer being a raw material layer of the upper surface electrode, and (a2) annealing the upper surface electrode material layer. The step (b) comprises steps of: (b1) depositing a lower surface electrode material layer on the lower surface of the substrate, the lower surface electrode material layer being a raw material layer of the lower surface electrode, and (b2) annealing the lower surface electrode material layer with a laser to make an ohmic contact between the lower surface electrode and the substrate.

In the above-mentioned manufacturing method, a temperature of annealing the upper surface electrode material layer in the annealing step (a2) may be lower than a temperature of annealing the lower surface electrode material layer with the laser in the annealing step (b2).

In the above-mentioned manufacturing method, the step (a) may further include a step of: (a3) forming a surface cover film on the surface side of the substrate.

In the annealing step (b2), the laser may be an UV laser having a wavelength equal to or longer than 150 nm and equal to or shorter than 400 nm, which may preferably be guided onto the lower surface electrode material layer.

The above-mentioned manufacturing method may further include a step of: (c) thinning the substrate. The step (c) may be performed between the step (a) and the step (b). The thinning step (c) may be a step of thinning the substrate to a thickness equal to or greater than 50 μm and equal to or smaller than 250 μm.

The upper surface electrode may primarily include at least one metal selected from the group consisting of Ti, Al, Mo and Ni. The lower surface electrode may primarily include Ni.

In the step (b2), the temperature of annealing the lower surface electrode material layer with the laser may be equal to or higher than 900° C. (Celsius degrees).

The present teachings may provide a manufacturing apparatus capable of being used in the annealing step (b2) of the manufacturing method relating to the present teachings. This manufacturing apparatus may be provided with a source of a UV laser; a sealed box; a laser transmittable window composed of a UV laser transmittable materials, formed on a surface of the sealed box; a stage disposed in the sealed box for setting a semiconductor wafer; an optical system for guiding the UV laser from the source of the UV laser to the semiconductor wafer on the stage through the laser transmittable window; a gas induction line that induces gases into the sealed box, and a decompressor that decompresses the sealed box.

The laser transmittable window may preferably be composed of at least one material selected from the group consisting of quartz, calcium fluoride ($CaF_2$), magnesium fluoride ($MgF_2$) and lithium fluoride (LiF).

The wavelength of the UV laser may preferably be equal to or longer than 150 nm and equal to or shorter than 400 nm.

According to the present teachings, both a protection of upper surface structures, such as an upper surface electrode formed on the upper surface of a semiconductor substrate, and a making of an ohmic contact between a lower surface electrode and the semiconductor substrate can be realized, even if an upper surface structure formation step (a) is carried out prior to a lower surface structure formation step (b).

Representative, non-limiting examples of the present teachings will now be described in further detail with reference to the attached drawings. This detailed description is merely intended to teach a person of skill in the art further details for practicing preferred aspects of the present teachings and is not intended to limit the scope of the appended claims. Furthermore, each of the additional features and teachings disclosed below may be utilized separately or in conjunction with other features and teachings to provide an improved method for manufacturing a semiconductor device.

Moreover, combinations of features and steps disclosed in the following detail description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

The following provides an explanation of a first embodiment of the present teachings with reference to the drawings. FIG. 1 is a drawing schematically showing a cross-section of a semiconductor device 5 manufactured according to a first manufacturing method relating to the first embodiment. The semiconductor device 5 is a diode having a Junction Barrier Schottky (JBS) structure. A semiconductor substrate 500 is provided with an n-type substrate layer 501 having silicon carbide as a material thereof, an n+-type epitaxial layer 502 laminated on the surface of the substrate layer 501 and having silicon carbide as a material thereof, and a p+-type anode layer 503 and p+-type blocking layer 504 provided on the surface of the epitaxial layer 502. The anode layer 503 is an anode layer having a JBS structure, while the blocking layer 504 employs a Junction Terminal Extension (JTE) structure provided as a peripheral blocking structure.

An interlayer insulating film 531, an upper surface electrode 511 and an upper surface junction electrode 512 are laminated in order from the side of the semiconductor substrate 500 on the upper surface of the semiconductor substrate 500 (side on which the epitaxial layer 502, the anode layer 503 and the blocking layer 504 are formed). The periphery of the upper surface junction electrode 512 and the surface of the interlayer insulating layer 531 are covered by a surface cover film 533. A lower surface electrode 521 and a lower surface junction electrode 522 are laminated in order from the side of the semiconductor substrate 500 on the lower surface of the semiconductor substrate 500 (side on which the substrate layer 501 is formed).

The upper surface electrode 511 forms a Schottky barrier junction with the upper surface of the epitaxial layer 502 of the semiconductor substrate 500 in a contact hole 532 provided in the interlayer insulating layer 531. A metal capable of forming the Schottky barrier junction with the epitaxial layer 502 may be used for the material of the upper surface electrode 511, and examples of materials that can be used include metals and alloys composed primarily of Ti, Al, Mo or Ni. A material such as a silicon oxide film or silicon nitride film can be used for the material of the interlayer insulating film 531. A resin such as polyimide can be used for the material of the surface cover film 533.

The lower surface electrode 521 makes an ohmic contact with the lower surface of the substrate layer 501 of the semiconductor substrate 500. The material of the lower surface electrode 521 may be a metal that is capable of making the ohmic contact with the substrate layer 501, and examples of materials that can be used include Ni electrodes (including electrodes primarily composed of Ni but containing components other than Ni) and Ni alloy electrodes such as Ni—Al alloy, Ni—Ti alloy, Ni—Mo alloy, Ni—Ta alloy or Ni—W alloy.

The upper surface junction electrode 521 and the lower surface junction electrode 522 are provided e.g. for the purpose of electrically connecting the semiconductor device 5 to an external terminal and the like, and they do not contact the semiconductor substrate 500. An Al electrode, for example, can be used for the upper surface junction electrode 512. A Ti/Ni/Au electrode, for example, which is obtained by laminating titanium (Ti), nickel (Ni) and gold (Au) in that order from the side of the semiconductor substrate, can be used for the lower surface junction electrode 522.

Figure 2:
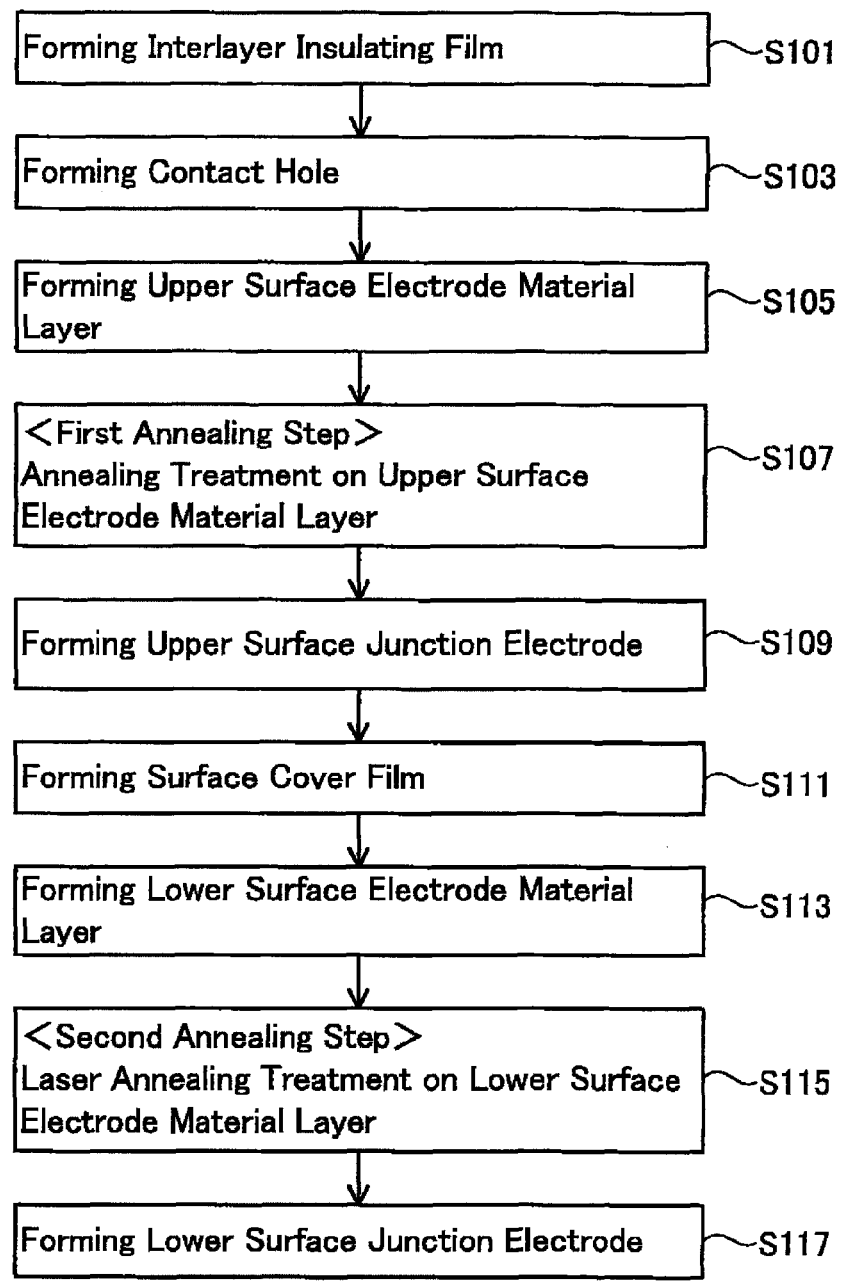
FIG. 2 is a flow chart showing a semiconductor device manufacturing method relating to a first embodiment.

Next, an explanation is provided of a first manufacturing method of the semiconductor device 5 relating to a first embodiment using FIGS. 1 and 2. The semiconductor device 5 is manufactured by forming a plurality of structures of the semiconductor device 5 shown in FIG. 1 on a semiconductor wafer followed by dicing and separating each of the semiconductor devices from the semiconductor wafer.

In this first manufacturing method, a semiconductor wafer on which a plurality of element structures provided on the semiconductor substrate 500 are formed is used as a raw material wafer. The raw material wafer is provided with the substrate layer 501, the epitaxial layer 502, the anode layer 503 and the blocking layer 504.

Next, insulating films, electrodes and cover films are formed on the upper and lower surfaces of the raw material wafer in accordance with the manufacturing flow shown in FIG. 2. The manufacturing flow shown in FIG. 2 comprises an insulating film formation step (Step S101), contact hole formation step (Step S103), upper surface electrode formation steps (Steps S105 and S107), upper surface junction electrode formation step (Step S109), surface cover film formation step (Step S111), lower surface electrode formation steps (Steps S113 and S115), and lower surface junction electrode formation step (Step S117), each of which will be subsequently explained. Structures such as the upper surface electrode formed on the upper surface of the semiconductor device 5 are referred to as "upper surface structures", while structures such as the lower surface electrode formed on the lower surface of the semiconductor device 5 are referred to as "lower surface structures". The upper surface structure formation step of forming the upper surface structure on the upper surface side of the substrate includes, e.g., the insulating film formation step, the contact hole formation step, the upper surface electrode formation steps, the upper surface junction electrode formation step and the surface cover film formation step shown in FIG. 2. The lower surface structure formation step of forming the lower surface structure on the lower surface side of the substrate includes, e.g., the lower surface electrode formation steps and the lower surface junction electrode formation step shown in FIG. 2.

(Insulating Film Formation Step)

In the insulating film formation step, the interlayer insulating film 531 is formed on the upper surface of the raw material wafer (Step S101). A method such as CVD, which is normally used to deposit an insulating film, can be used to deposit the interlayer insulating film 531 in Step S101.

(Contact Hole Formation Step)

In the contact hole formation step, the contact hole 532 is formed in the interlayer insulating film 531 formed in the insulating film formation step (Step S103). Step S103 includes a step of forming a photoresist patterned to match the contact hole 532 in the surface of the interlayer insulating film 531, and a step of removing the interlayer insulating film 531 using the formed photoresist. In the step of removing the interlayer insulating film 531, the portion of the interlayer insulating layer 531 that forms the contact hole 532 is removed by etching and the like. As a result, the contact hole 532 can be formed. Materials and methods normally used during photoetching of an insulating film can be used for the material of photoresist, the photoresist formation method and the etching method.

(Upper Surface Electrode Formation Steps)

In the subsequent upper surface electrode formation steps, the upper surface electrode 511 is formed in contact with the upper surface of the raw material wafer. The upper surface electrode formation steps include an upper surface electrode material layer deposition step (Step S105) of depositing an upper surface electrode material layer on the upper surface of the substrate, the upper surface electrode material layer being a raw material layer of the upper surface electrode and a first annealing step (Step S107) for annealing the upper surface electrode material layer. In upper surface electrode material layer deposition step, an electrode layer serving as a material of the upper surface electrode (to be referred to as the upper surface electrode material layer in the present description) is deposited so as to contact the upper surface of the raw material wafer. In the first annealing step, annealing treatment is carried out on the deposited upper surface electrode material layer. The upper surface electrode material layer is deposited in the contact hole 532 so as to contact the raw material wafer.

(Upper Surface Electrode Material Deposition Step)

In Step S105, after having deposited the electrode layer (such as an Al layer, Mo layer, Ti layer or Ni layer) such that the electrode layer contacts the upper surface of the raw material layer, a patterned photoresist or the like is formed on the upper surface of the deposited electrode layer, and a portion of the deposited electrode layer is removed by etching using this photoresist. As a result, the upper surface electrode material layer can be deposited. Vapor deposition or sputtering is preferably used to deposit the electrode layer to as to contact the upper surface of the raw material wafer.

(First Annealing Step)

Next, the first annealing step is carried out (Step S107). In the first annealing step, annealing treatment can be carried out on the upper surface electrode material layer using e.g. an annealing oven. Although an infrared lamp RTA oven capable of rapid heating and cooling is preferable for the annealing oven, the annealing oven is not limited thereto. The treatment time of annealing treatment is preferably within 60 minutes, and the heating and cooling rates are preferably 100° C./min or more in order to reduce thermal hysteresis of the raw material wafer on which the upper surface electrode material layer is formed. The ambient temperature within the annealing oven during annealing treatment in the first annealing step is set lower than the temperature required for the lower surface electrode to be described later to make an ohmic contact on the semiconductor substrate. Although varying according to the material used for the upper surface electrode, the ambient temperature within the annealing oven in the first annealing step is within the range of about 400 to 900° C., which is lower than the temperature required for the lower surface electrode to make the ohmic contact on the semiconductor substrate in a second annealing step to be described later (referred to as the lower surface ohmic contact temperature in the present description). In the case of using a Ti layer, for example, for the upper surface electrode, the ambient temperature within the annealing oven is preferably about 400° C. In addition, in the case of using e.g. a Mo layer for the upper surface electrode, the ambient temperature within the annealing oven is preferably about 900° C.

An inert gas such as argon (Ar) or helium (He) can be used for the atmospheric gas in the case of carrying out annealing treatment, and treatment is preferably carried out in a vacuum at 10 Torr or lower. A reducing gas such as several vol % $H_2$ gas is more preferably contained in the Ar or He gas used for the atmospheric gas.

(Upper Surface Junction Electrode Formation Step)

Next, the upper surface junction electrode formation step (Step S109) is carried out. The upper surface junction electrode formation step includes a step of depositing a metal layer or alloy layer serving as the material of the upper surface junction electrode 512 on the upper surface of the upper surface electrode 511 by sputtering and the like, a step of forming a patterned photoresist on the upper surface of the deposited metal layer or alloy layer, and a step of removing a portion of the deposited metal layer or alloy layer by etching. As a result, the upper surface junction electrode 512 can be formed.

(Surface Cover Film Formation Step)

Next, the surface cover film formation step (Step S111) of forming a surface cover film on the surface side of the substrate is carried out. In the case of using a polyimide film for the surface cover film 533, the polyimide film is first coated onto the upper surface of the raw material wafer and dried in the surface cover film formation step. Next, a patterned photoresist is formed on the upper surface of the dried polyimide film, and a portion of the polyimide film is removed by etching using this photoresist. Next, the cover film is cured by heat treatment. As a result, the surface cover film 533 can be formed after having been patterned so as to cover the periphery of the upper surface junction electrode 512 and the upper surface of the interlayer insulating film 531 on the upper surface of the raw material wafer. In the case of using a resin for the surface cover film, the heat resistant temperature of the surface cover film is lower than the lower surface ohmic contact temperature to be described later.

(Lower Surface Electrode Formation Steps)

Next, in the lower surface electrode formation steps, the lower surface electrode 521 is fanned in contact with the lower surface of the raw material wafer. The lower surface electrode formation steps include a lower surface electrode material layer deposition step (Step S113) of depositing a lower surface electrode material layer on the lower surface of the substrate, the lower surface electrode material layer being a raw material layer of the lower surface electrode and a second annealing step (Step S115) of annealing the lower surface electrode material layer with a laser to make an ohmic contact between the lower surface electrode and the substrate. In the lower surface electrode material layer deposition step, an electrode layer serving as the raw material of the lower surface electrode (lower surface electrode material layer) is deposited so as to contact the lower surface of the raw material wafer. In the second annealing step, annealing treatment is carried out on the deposited lower surface electrode material layer.

(Lower Surface Electrode Material Layer Deposition Step)

In Step S113, an electrode layer (such as an Ni layer) is deposited by vapor deposition, for example, on the lower surface of the raw material wafer. As a result, the lower surface electrode material layer can be formed. Step S113 may further include a step of forming a patterned photoresist on the lower surface of the deposited electrode layer, and a step of removing a portion of the deposited electrode layer by etching using this photoresist. As a result, the lower surface electrode material layer can be patterned.

(Second Annealing Step)

Next, the second annealing step (Step S115) is carried out. In the second annealing step, laser annealing treatment is carried out on the lower surface electrode material layer. As a result of this laser annealing treatment, the lower surface electrode material layer is heated to a temperature required for making an ohmic contact between the lower surface electrode and the semiconductor substrate (lower surface ohmic contact temperature). As a result, the lower surface electrode 521 that makes the ohmic contact with the raw material wafer can be obtained. The temperature at which the lower surface of the raw material wafer is heated in the second annealing step is equal to or higher than the lower surface ohmic contact temperature. For example, if the lower surface ohmic contact temperature is 900° C., then the temperature at which the lower surface of the raw material wafer is heated can be about 1000° C.

In the case of using an Ni layer for the material of the lower surface electrode material layer, the lower surface ohmic contact temperature is 900° C. or higher. In order to obtain the lower surface electrode that makes the ohmic contact with the raw material wafer, the temperature on the lower surface of the raw material wafer on which the lower surface electrode material layer is formed is raised to a prescribed temperature set within the range of 900° C. or higher, which is the lower surface ohmic contact temperature, in the second annealing step. If the laser annealing treatment is used, the lower surface of the raw material wafer can be heated without causing hardly any heating of the upper surface of the raw material wafer. For example, despite heating the temperature on the lower surface of the raw material wafer to 900° C. or higher, the temperature on the upper surface of the raw material wafer can be maintained at a low temperature of 300° C. or lower.

UV laser light is preferable for the laser light used for laser annealing treatment. The use of the UV laser light makes it possible to reduce the penetration depth into the semiconductor wafer having silicon carbide as the material thereof. In the case of irradiating the lower surface of the raw material wafer with the UV laser light, a large temperature difference can be created between the temperature on the lower surface of the raw material wafer (side that is heated to a high temperature) and the temperature on the upper surface.

The wavelength of the UV laser light is preferably 150 to 400 nm. Even if the raw material wafer is comparatively thin at about 100 μm, as long as the wavelength of the UV laser light is 400 nm or less, the temperature on the upper surface of the raw material wafer can be held to 300° C. or lower even if the lower surface of the raw material wafer is heated to 1000° C. or higher.

Figure 3:
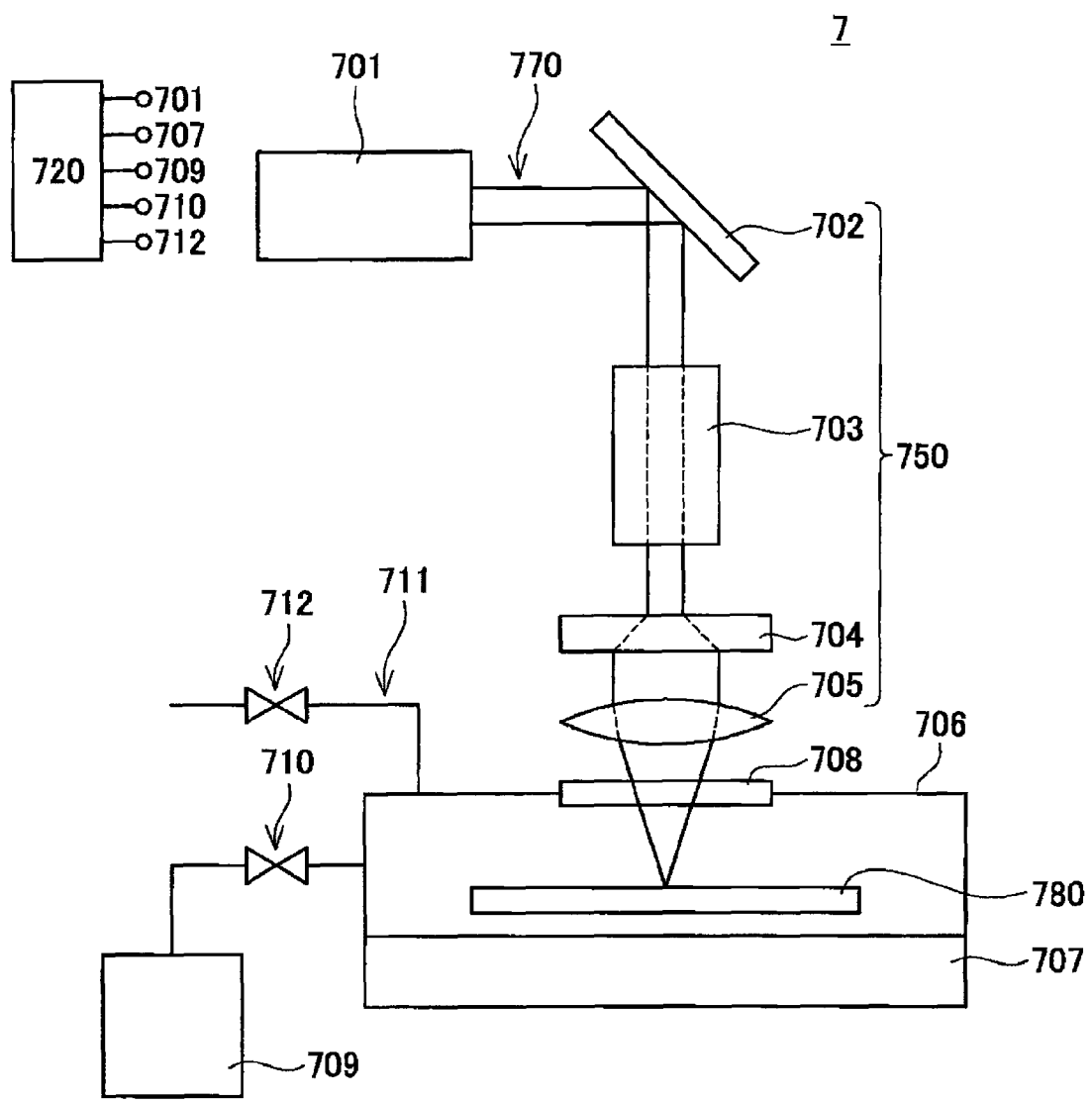
FIG. 3 is a drawing schematically showing a semiconductor device manufacturing apparatus relating to a first embodiment.

Laser annealing treatment can be carried out, for example, using a manufacturing apparatus 7 shown in FIG. 3. As shown in FIG. 3, the manufacturing apparatus 7 is provided with a source of a UV laser 701, an optical system 750, a sealed box 706, a stage 707, a laser transmittable window 708 provided in the sealed box, a decompressor 709, and a gas induction line 711. A pressure reduction valve 710 is disposed between the decompressor 709 and the sealed box 706, and a gas valve 712 is disposed in the gas induction line 711. The manufacturing apparatus 7 is also provided with a controller 720. The controller 720 controls the source of a UV laser 701, the stage 707, the decompressor 709, the pressure reduction valve 710 and the gas valve 712.

A raw material wafer 780 can be disposed inside the sealed box 706 by setting the wafer material wafer 780 on the stage 707. The raw material wafer 780 is set on the stage 707 so that the lower surface on which the lower surface electrode material layer is formed is on the side facing the laser transmittable window 708. The stage 707 adheres and holds the raw material, wafer 780 by a force generated by applying a voltage between the stage 707 and the wafer (in the form of a so-called electrostatic chuck). A cooling unit (not shown) is provided on the stage 707 for cooling the raw material wafer 780.

Reference number 770 schematically indicates the light path of the UV laser light. The UV laser light 770 emitted from the source of the UV laser 701 is guided to the raw material wafer 780 on the stage 707 by the optical system 750. The optical system 750 can be composed of, for example, a mirror 702, an aperture 703, an expander 704 and a lens 705. In this case, the UV laser light 770 from the source of the UV laser 701 is reflected by the mirror 702 and enters the aperture 703. The aperture 703 has the function of a diaphragm, and the focused UV laser light 770 is expanded in beam diameter by the expander 704 after which it enters the lens 705. The lens 705 is a focusing lens, and the UV laser light 770 that has passed through the lens 705 then passes through the laser transmittable window 708 and is guided onto the raw material wafer 780 inside the sealed box 706.

An excimer laser such as ArF (wavelength: 193 nm), KrF (wavelength: 248 nm), XeCl (wavelength: 308 nm), XeF (wavelength: 353 nm) or $F_2$ (wavelength: 157 nm), or a solid-state laser such as YAG can be preferably used for the source of the UV laser 701. The source of the UV laser is preferably, but not limited to, a source of a UV laser having a wavelength of 150 to 400 nm.

The laser transmittable window 708 is formed from a material capable of transmitting UV laser light. At least one type of materials selected from the group consisting of quartz, calcium fluoride ($CaF_2$), magnesium fluoride ($MgF_2$) and lithium fluoride (LiF) is preferably used for the material of the laser transmittable window 708.

The inside of the sealed box 706 can be decompressed by controlling the decompressor 709 and the pressure reduction valve 710. Gas can be induced into the sealed box 706 by controlling the gas valve 712. A vacuum pump such as a dry pump, turbomolecular pump or cryopump can be preferably used for the decompressor 709. An inert gas or reducing gas and the like can be induced into the sealed box 706 by the gas induction line 711. Examples of inert gases that can be used include argon (Ar) gas and helium (He) gas. Examples of reducing gases that can be used include a reducing gas such as $H_2$ gas at several vol %.

Laser annealing treatment is preferably carried out while generating a high vacuum within the sealed box of $1 \times 10^{-5}$ Torr or lower, and a reducing gas such as $H_2$ gas at several vol % is more preferably contained in the Ar or He gas used for the atmospheric gas.

The controller 720 is able to control the source of the UV laser 701, the stage 707, the decompressor 709, the pressure reduction valve 710 and the gas valve 712 based on prescribed control conditions preset on the basis of experimental or other results. In addition, in the case the manufacturing apparatus 7 is provided with a temperature sensor and pressure sensor, the controller 720 may control the source of the UV laser 701, the stage 707, the decompressor 709, the pressure reduction valve 710 and the gas valve 712 based on detected values of the temperature sensor and pressure sensor. For example, in the case the temperature sensor for detecting the lower surface temperature of the raw material wafer 780 (temperature on the side irradiated with laser light) is provided in the manufacturing apparatus 7, the controller 720 may control the source of the UV laser 701 based on the lower surface temperature of the raw material wafer 780 detected by this temperature sensor.

(Lower Surface Junction Electrode Formation Step)

Next, the lower surface junction electrode formation step is carried out (Step S117). The lower surface junction electrode formation step includes a step of depositing metal layer or alloy layer serving as a material of lower surface junction electrode 522 by sputtering so as to contact the lower surface of the lower surface electrode 521. Step S117 may further include a step of forming a patterned photoresist on the upper surface of the deposited metal layer or alloy layer, and a step of removing a portion of the deposited metal layer or alloy layer by etching. As a result, the lower surface junction electrode can be patterned.

Moreover, when the semiconductor wafer is severed by dicing and the like, it can be cut apart into a single semiconductor device 5. As a result, the semiconductor device 5 shown in FIG. 1 can be obtained.

As has been described above, in the semiconductor device manufacturing method relating to the present embodiment, the lower surface structure formation step is carried out after having carried out the upper surface structure formation step. In the second annealing step included in the lower surface structure formation step, the ohmic contact is made between the lower surface electrode and the semiconductor substrate by irradiating the lower surface electrode material layer with the laser light and annealing the lower surface electrode material layer. Consequently, even in the case the first annealing step is carried out at a temperature lower than the temperature at which the lower surface electrode material layer is annealed (temperature of the lower surface of the semiconductor wafer irradiated with laser light), the upper surface structures such as the upper surface electrode formed on the upper surface of the semiconductor substrate can be protected. Thus, both the protection of the upper surface structures, such as the upper surface electrode formed on the upper surface of the semiconductor substrate, and the making of the ohmic contact between the lower surface electrode and the semiconductor substrate can be realized.

Example 1

The following provides a more detailed explanation of an Example 1 that embodies the first embodiment as described above.

(Preparation of Raw Material Wafer)

An n⁻-type epitaxial layer (impurity concentration: $5 \times 10^{15}$ cm$^{-3}$, layer thickness: 10 μm) was deposited on the upper surface of a 4H—SiC n⁺-type semiconductor wafer (impurity concentration: $8 \times 10^{18}$ cm$^{-3}$) having a diameter of 100 mm and thickness of 350 μm. This semiconductor wafer is equivalent to the substrate layer 501 shown in FIG. 1, and this epitaxial layer is equivalent to the epitaxial layer 502 shown in FIG. 1. Moreover, Al ions were injected into the upper surface of the epitaxial layer for forming a p⁺-type JTE structure, after which Al ions were injected into the upper surface of the epitaxial layer for forming a p⁺-type JBS structure. Subsequently, annealing was carried out to form the p⁺-type JTE structure (impurity concentration: $1 \times 10^{19}$ cm$^{-3}$, width: 50 μm, depth: 1 μm) and the p⁺-type JBS structure (striped structure, impurity concentration: $1 \times 10^{19}$ cm$^{-3}$, interval: 5 μm, width: 2 μm, depth: 1 μm). This p⁺-type JTE structure is equivalent to the blocking layer 504 shown in FIG. 1, while this p⁺-type JBS structure is equivalent to the anode layer 503 shown in FIG. 1.

According to the above method, a plurality of diodes of a chip size of 6 mm×6 mm and having a JBS structure was produced on the semiconductor wafer. Electrodes are formed on the upper surface and lower surface of the raw material wafer in accordance with the flow shown in FIG. 2 using the semiconductor wafer in this state for the raw material wafer.

(Insulating Film Formation Step)

In the insulating film formation step (Step S101), a silicon oxide film (SiO$_2$ film) was deposited on the upper surface of the raw material wafer as the interlayer insulating film 531. An SiO$_2$ film having a thickness of 1 μm was deposited using vacuum CVD for the deposition method.

(Contact Hole Formation Step)

In the next contact hole formation step (Step S103), a photoresist was first formed on the upper surface of the SiO$_2$ film formed in the insulating film formation step. Moreover, a contact hole was formed by removing the portion of the SiO$_2$ film where the contact hole is formed by etching. This contact hole is equivalent to the contact hole 532 shown in FIG. 1. In the present example, the size of the contact hole was adjusted so that the active size of the diode was 5.5×5.5 mm.

(Upper Surface Electrode Formation Steps)

Next, an upper surface electrode was formed by carrying out the upper surface electrode formation steps (Steps S105 and S107). Ti was used for the material of the upper surface electrode.

(Upper Surface Electrode Material Layer Deposition Step)

First, as shown in Step S105 of FIG. 2, the upper surface electrode material layer deposition step was carried out to deposit a Ti layer on the upper surface of the raw material wafer (side on which the interlayer insulating film is formed) as an upper surface electrode material layer. This Ti layer was deposited to a thickness of 100 nm using a vapor deposition method at 120° C. Moreover, a patterned photoresist was formed on the upper surface of the Ti layer at the portion of the deposited Ti layer that is not etched. Next, a portion of the deposited Ti layer was removed by etching using an aqueous ammonia/H$_2$O$_2$ solution. As a result, the upper surface electrode material layer can be obtained.

(First Annealing Step)

Next, the first annealing step is carried out to carry out annealing treatment on the upper surface electrode material layer (deposited Ti layer). The raw material wafer was set in an infrared lamp RTA oven and annealing treatment was carried out on the upper surface electrode material layer at a treatment temperature of 400° C. Argon (Ar) gas containing 3 vol % of H$_2$ was used for the atmospheric gas in the case of carrying out annealing treatment, and annealing treatment was carried out at 10 Torr or less. The ambient temperature was 400° C., the heating rate was 100° C./min, and the treatment time was 30 minutes. As a result, the barrier height of the interface between the upper surface electrode and the raw material wafer was made to be 1.1 eV, and a Schottky barrier junction was formed between the upper surface electrode and the upper surface of the raw material wafer.

(Upper Surface Junction Electrode Formation Step)

In the next upper surface junction electrode formation step (Step S109), an Al electrode was formed as the upper surface junction electrode 512. First, an Al layer was formed to a thickness of 3 μm by sputtering. Moreover, a patterned photoresist was formed on the upper surface of the Al layer at the portion of the deposited Al layer that is not etched. Next, a portion of the Al layer was removed by etching using a phosphoric acid/nitric acid/acetic acid solution. As a result, an Al electrode was formed as the upper surface junction electrode 512.

(Surface Cover Film Formation Step)

In the next surface cover film formation step (Step S111), a polyimide layer was formed as the surface cover film 533. After coating polyimide onto the upper surface of the raw material wafer to a thickness of 5 μm and drying, patterning was carried out to expose a portion of the upper surface junction electrode. The polyimide film obtained in this manner was then cured by heat-treating at 300° C.

(Lower Surface Electrode Formation Steps)

In the next lower surface electrode formation steps (Steps S113 and S115), an Ni electrode was formed in contact with the lower surface of the raw material wafer as the lower surface electrode 521.

(Lower Surface Electrode Material Layer Deposition Step)

In the lower surface electrode material layer deposition step (S113), an Ni layer was deposited as the lower surface electrode material layer. The Ni layer was deposited to a thickness of 100 nm on the lower surface of the raw material wafer by sputtering.

(Second Annealing Step)

Next, the second annealing step (Step S115) was carried out. In the second annealing step, laser annealing treatment was carried out on the deposited lower surface electrode material layer (Ni layer) using the semiconductor device production apparatus 7 shown in FIG. 3. An excimer laser having a wavelength of 248 nm was used for the laser light source, and the lower surface of the raw material wafer was heated to 1000° C. As a result, nickel silicide (for example, Ni$_2$Si) was formed between the Ni layer and the raw material wafer, and the Ni electrode was obtained that was joined to the raw material wafer by an ohmic contact.

(Lower Surface Junction Electrode Formation Step)

In the subsequent lower surface junction electrode formation step, a Ti layer, Ni layer and Au layer were formed by sputtering in that order from the lower surface of the raw material wafer on which the lower surface electrode was formed. The thickness of the Ti layer was 100 nm, that of the Ni layer was 100 nm, and that of the Au layer was 50 nm.

(Dicing Step)

Moreover, dicing and the like was carried out to produce a JBS structure diode having a chip size of 6 mm×6 mm and an active size of 5.5 mm×5.5 mm.

The barrier height of the interface between the upper surface electrode and the semiconductor substrate was measured using the diode manufactured according to the manufacturing method described above. Furthermore, barrier height was calculated by measuring I-V characteristics in the forward direction by applying a forward voltage of 0 to 3 V in 0.01 V increments using a 4142B Modular DC Source/Monitor System (produced by Agilent Technologies), and then applying the resulting I-V characteristics to the following formula (1):

$$Jo = AT^2 \exp(-q\phi/(kT)) \tag{1}$$

Jo: current density (current during forward voltage of 0 V/active area), A: Richardson's constant (146 A/K$^2$-cm$^2$), T: absolute temperature (293K), q: charge ($1.602\times10^{-19}$ C), k: Boltzmann constant ($1.38\times10^{-23}$ J/K).

As a result, the barrier height of the interface between the upper surface electrode and the semiconductor substrate was 1.1 eV, and the upper surface electrode had formed a Schottky bather junction with the epitaxial layer of the semiconductor substrate. In the present example, the upper surface electrode formation steps were carried under the condition of a barrier height of the interface between the upper surface electrode and the semiconductor substrate of 1.1 eV. The value of the bather height adjusted in the upper surface electrode formation steps was maintained throughout the lower surface structure formation step, including the second annealing step and the like.

In addition, the upper surface junction electrode and surface cover film of the diode manufactured according to the manufacturing method described above were observed using a light microscope and scanning electron microscope. Abnormalities such as disruptions in the surface thereof or melting of the surface were not observed for either the upper surface junction electrode or surface cover film.

As was previously described, in Example 1, laser annealing treatment was carried out in the second annealing step under the condition of heating the lower surface of the raw material wafer to 1000° C. in order to make an ohmic contact between the lower surface electrode and the semiconductor substrate. In the case of using an Ni layer for the material of the lower surface electrode, the lower surface ohmic contact temperature is 900° C. or higher. Even if the first annealing step was carried out at a temperature lower than 900° C. (400° C.), the upper surface structure formation step, including the first annealing step, was carried out prior to the lower surface structure formation step, including the second annealing step, and the Schottky barrier junction between the upper surface electrode and the epitaxial layer of the semiconductor substrate was maintained. In addition, even in the case of carrying out surface cover film formation step at a temperature lower than 900° C. (300° C.), the upper surface structure formation step, including the surface cover film formation step, was carried out prior to the lower surface structure formation step, including the second annealing step, and disruptions or melting of the surface of the surface cover film were not observed. According to the present example, even if a silicon carbide semiconductor device is produced according to a manufacturing method in which the upper surface structure formation step is carried out first while the lower surface structure formation step is carried out thereafter, both the protection of upper surface structures such as the upper surface electrode formed on the upper surface of the semiconductor substrate, and the protection of the ohmic contact between the lower surface electrode and the semiconductor substrate, were clearly determined to be able to realized.

In addition, in the semiconductor device manufacturing method of the first embodiment, steps required to be carried out prior to the lower surface structure formation step can be carried out after all of the manufacturing steps. For example, there are cases in which a semiconductor device manufacturing method includes a thinning step of thinning the raw material wafer. In this thinning step, the semiconductor substrate that composes the lower surface of the raw material wafer (such as the lower surface of the substrate layer 501 in FIG. 1) is thinned. When the raw material wafer is thinned, although parasitic resistance of the semiconductor device is reduced resulting in a reduction in loss of the semiconductor device, if the raw material wafer is thinned excessively, the strength of the raw material wafer decreases, resulting in the occurrence of bending or cracking of the wafer such as when setting and removing in and from the production apparatus. It is necessary to carry out this thinning step prior to the lower surface structure formation step in order to thin the lower surface of the raw material wafer.

Figure 4:
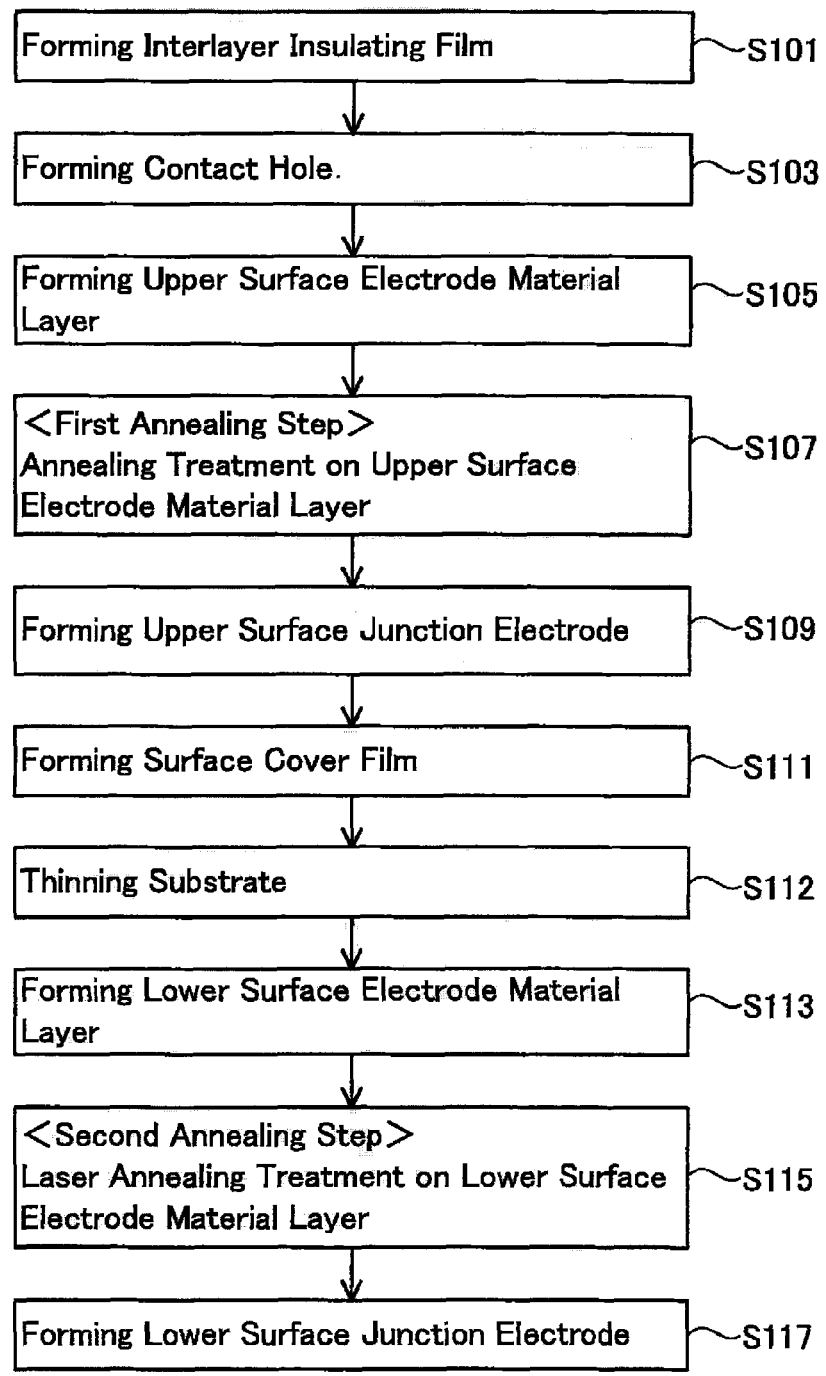
FIG. 4 is a flow chart showing a semiconductor device manufacturing method relating to a variation.

In the case of carrying out a thinning step in the semiconductor device manufacturing method of the first embodiment, as shown in FIG. 4 Steps S101 to S111 included in the upper surface structure formation step can be carried out prior to the thinning step (Step S112) for thinning the substrate. Since the thinning step of the semiconductor wafer can be carried out in a step after the manufacturing process, there is less susceptibility of the occurrence of damage, etc. to the wafer. Namely, since the upper surface structure formation step can be carried out prior to the thinning step, there is less likelihood of the occurrence of wafer damage and the like in the upper surface structure formation step. In the thinning step (Step S112), the substrate layer 501 of the raw material wafer is preferably thinned to about 50 to 250 µm, and particularly preferably thinned to 100 to 200 µm.

Second Embodiment

A semiconductor device capable of being manufactured according to the manufacturing method relating to the present teachings may be a semiconductor device having an upper surface electrode in contact with the upper surface of the semiconductor substrate and a lower surface electrode in contact with the lower surface of the semiconductor substrate. An explanation of the second embodiment is provided using as an example a MOSFET shown in FIG. 5 as an example of the semiconductor device alternative to the diode explained in the first embodiment.

Figure 5:
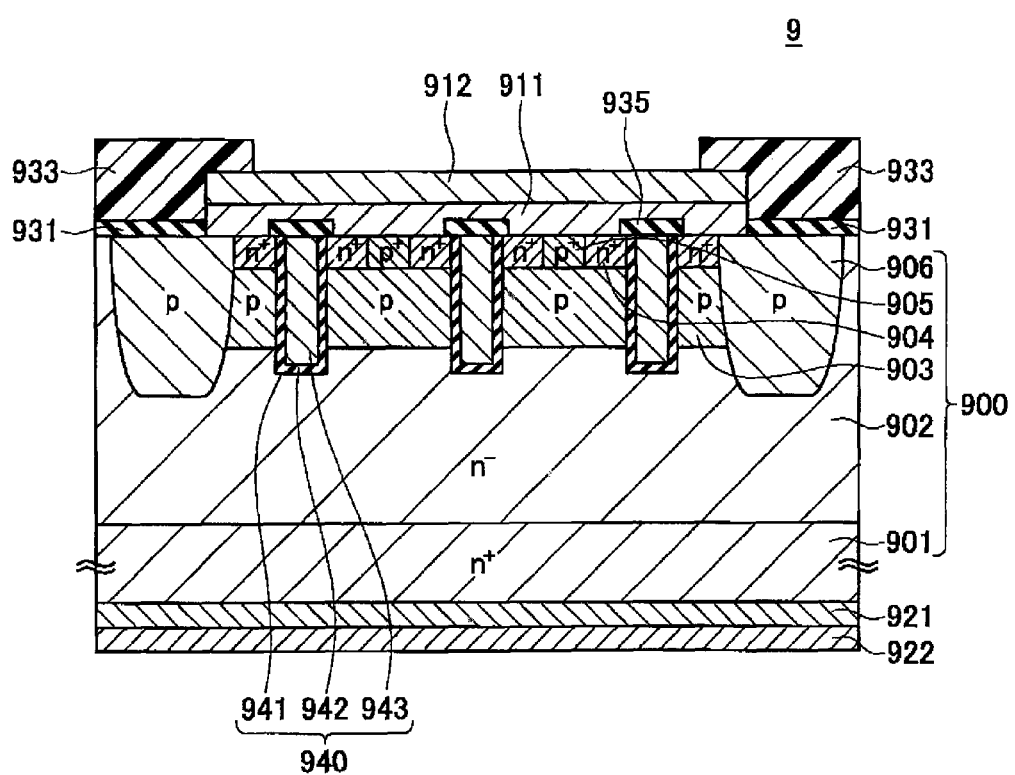
FIG. 5 is a cross-sectional view of a semiconductor device manufactured in a second embodiment.

FIG. 5 is a drawing schematically showing a cross-section of a semiconductor device 9 manufactured according to a second manufacturing method relating to the second embodiment. The semiconductor device 9 is a MOSFET. A semiconductor substrate 900 is provided with an n-type drain layer 901, having as a material thereof a semiconductor substrate having silicon carbide as a material thereof, a drift layer 902 laminated on the upper surface of the semiconductor substrate serving as the drain layer 901 and formed by an n$^+$-type epitaxial having silicon carbide as a material thereof, a p-type body layer 903 and a blocking layer 906 provided on the upper surface of the drift layer 902, and an n$^+$-type source layer 904 and a p+-type contact layer 905 formed on the upper surface of the body layer 903. The body layer 903 penetrates from the upper surface of the semiconductor substrate 900, resulting in the formation of a trench gate 940 that reaches the drift layer 502. The trench gate 940 is provided with a trench 941 formed in the semiconductor substrate 900, a gate insulating film 942 formed on the inner surface of the trench 941, and a gate electrode 943 covered by the gate insulating film 942. The blocking layer 906 is a peripheral blocking structure, and is formed so as to surround the body layer 903, the source layer 904, the contact layer 905, the trench gate 940 and the like.

Interlayer insulating films 931 and 935, an upper surface electrode 911 and an upper surface junction electrode 912 are laminated in order from the side of the semiconductor substrate 900 on the upper surface of the semiconductor substrate 900 (side on which the source layer 904, the contact layer 905 and the blocking layer 906 are formed).

The upper surface electrode 911 is a source electrode that makes an ohmic contact with the upper surfaces of the source layer 904 and the contact layer 905 of the semiconductor substrate 900. A metal or metal alloy composed primarily of Ni and the like, for example, can be used for the material of the upper surface electrode 911. The same materials as those explained in the first embodiment, for example, can be used for the material of the interlayer insulating films 931 and 935 and the surface cover film 933.

The interlayer insulating film 931 is formed on the upper surfaces of the drift layer 902 and the blocking layer 906 exposed on the upper surface of the semiconductor substrate 900, while the interlayer insulating film 935 insulates the gate electrode 943 from the upper surface electrode 911.

The periphery of the upper surface junction electrode 912 and the surface of the interlayer insulating layer 931 are covered by the surface cover film 933. A lower surface electrode 921 and a lower surface junction electrode 922 are laminated in order from the side of the semiconductor substrate 900 on the lower surface of the semiconductor substrate 900 (side on which the drain layer 901 is formed).

The lower surface electrode 921 is a drain electrode that makes an ohmic contact with the lower surface of the drain layer 901 of the semiconductor substrate 900. The material of the lower surface electrode 921 is a metal capable of making an ohmic contact with the semiconductor substrate 900, and the same materials as those explained in the first embodiment, for example, can be used for the material of the lower surface electrode 921.

Similar to the semiconductor device 5, the upper surface junction electrode 921 and the lower surface junction electrode 922 are provided for the purpose of, for example, electrically connecting the semiconductor device 9 to an external terminal and the like, and do not contact the semiconductor substrate 900. The same materials as those explained in the first embodiment can be used for the materials of the upper surface junction electrode 912 and the lower surface junction electrode 922.

Next, an explanation is provided of a first manufacturing method of the semiconductor device 9 relating to the second embodiment using FIG. 6. The semiconductor device 9 is produced by forming a plurality of structures of the semiconductor device 9 shown in FIG. 5 on a semiconductor wafer followed by dicing and separating each semiconductor device from the semiconductor wafer.

In this second manufacturing method, a semiconductor wafer on which a plurality of element structures provided on the semiconductor substrate 900 are formed is used as a raw material wafer. This raw material wafer is provided with the drain layer 901, the drift layer 902, the body layer 903, the source layer 904, the contact layer 905 and the blocking layer 906.

The source layer 904 and the contact layer 905 can be formed, for example, according to the following procedure. First, a patterned resist is formed on the upper surface (surface on which the body layer 903 is formed) of a semiconductor wafer provided with the drain layer 901, the drift layer 902 and the body layer 903, and ion implantation is carried out from the upper surface of the semiconductor wafer through this resist. Subsequently, this semiconductor wafer is annealed. As a result, the source layer 904 and the contact layer 905 are formed.

Next, insulating films, electrodes and cover films, for example, are formed on the upper and lower surfaces of the raw material wafer in accordance with the manufacturing flow shown in FIG. 6. The manufacturing flow shown in FIG. 6 includes an insulating film formation step (Step S201), a gate trench formation step (Step S203), upper surface electrode formation steps (Steps S205 and S207), an upper surface junction electrode formation step (Step S209), a surface cover film formation step (Step S211), lower surface electrode formation steps (Steps S213 and S215), and a lower surface junction electrode formation step (Step S217) as explained below. Structures such as the upper surface electrode formed on the upper surface of the semiconductor device 9 are referred to as "upper surface structures", while structures such as the lower surface electrode formed on the lower surface of the semiconductor device 9 are referred to as "lower surface structures". The upper surface structure formation step includes, for example, the insulating film formation step, gate trench formation step, upper surface electrode formation steps, upper surface junction electrode formation step and surface cover film formation step shown in FIG. 6. The lower surface structure formation step includes, for example, the lower surface electrode formation steps and lower surface junction formation step shown in FIG. 6.

(Insulating Film Formation Step)

In the insulating film formation step, the interlayer insulating films 931 and 935 are deposited on the upper surface of the raw material wafer (Step S201). A method normally used to deposit an insulating film, such as CVD, can be used to deposit the interlayer insulating film 931 in Step S201 in the same manner as the first embodiment.

(Gate Trench Formation Step)

The gate trench formation step includes a trench formation step of forming a trench in the raw material wafer, a gate oxide film formation step of forming a gate oxide film on the inner wall of the trench, and a gate electrode formation step of forming a gate electrode within the trench in which the gate oxide film is formed on the inner wall thereof. In the trench formation step, for example, a patterned photoresist is formed on the upper surface of the body layer of the raw material wafer and etching is carried out using the photoresist to penetrate the body layer of the raw material wafer and form a trench that reaches the drift layer. In the gate oxide film formation step, a gate oxide film can be formed on the inner wall of the trench according to a method similar to that used in the prior art. In addition, in the gate electrode formation step, for example, the gate electrode can be formed by filling an electrically conductive material (such as polysilicon) into the oxide film by CVD and the like.

(Upper Surface Electrode Formation Steps)

In the upper surface electrode formation steps carried out next, the upper surface electrode 911 is formed in contact with the upper surface of the raw material wafer. The upper surface electrode 911 is a source electrode of a MOSFET. The upper surface electrode formation steps include an upper surface electrode material layer deposition step (Step S205) for depositing an electrode layer serving as the material of the upper surface electrode 911 (upper surface electrode material layer) so as to contact the upper surface of the raw material wafer, and a first annealing step (Step S207) for carrying out annealing treatment on the deposited upper surface electrode material layer.

(Upper Surface Electrode Material Layer Deposition Step)

In Step S205, for example, a layer serving as the material of the upper surface electrode is deposited so as to contact the upper surface of the raw material wafer, followed by forming a patterned photoresist on the upper surface of the deposited layer and removing a portion of the deposited layer by etching using this photoresist. As a result, the surface electrode material layer can be formed.

(First Annealing Step)

Next, the first annealing step is carried out (Step S207). In the first annealing step, annealing treatment can be carried out on the upper surface electrode material layer using an annealing oven, for example, in the same manner as the first embodiment. In addition, the ambient temperature in the annealing oven when carrying out annealing treatment in the first annealing step is set lower than the temperature required for the lower surface electrode to be described later to make an ohmic contact on the semiconductor substrate.

(Upper Surface Junction Electrode Formation Step)

Next, the upper surface junction electrode formation step is carried out (Step S209). An explanation of the upper surface junction electrode formation step is omitted here since it is the same as the Step S109 explained in the first embodiment.

(Surface Cover Film Formation Step)

Next, the surface cover film formation step is carried out (Step S211). Polyimide resin, for example, can be used for the material of the surface cover film in the same manner as the Step S111 explained in the first embodiment, and the surface cover film can be formed using the same method as in the first embodiment. In the case of using a resin for the surface cover film, the heat resistant temperature of the surface cover film is lower than the temperature required for the lower surface electrode to make an ohmic contact on the semiconductor substrate.

(Lower Surface Electrode Formation Steps)

In the lower surface electrode formation steps carried out next, the lower surface electrode 921 is formed in contact with the lower surface of the raw material wafer. The lower surface electrode 921 is the drain electrode of the MOSFET. Similar to the first embodiment, the lower surface electrode formation steps include the lower surface electrode material layer deposition step of depositing the electrode layer serving as the material of the lower surface electrode (lower surface electrode material layer) so as to contact the lower surface of the raw material wafer (Step S213), and a second annealing step of carrying out annealing treatment on the deposited lower surface electrode material layer (Step S215).

(Lower Surface Electrode Material Layer Deposition Step)

In Step S213, for example, the lower surface electrode material layer is deposited so as to contact the lower surface of the raw material wafer. Step S213 may further include a step of patterning the lower surface electrode material layer.

(Second Annealing Step)

Next, the second annealing step is carried out (Step S215). In the second annealing step, a laser annealing treatment is carried out on the lower surface electrode material layer. As a result, the lower surface electrode 921 can be obtained that makes an ohmic contact with the raw material wafer. In this second embodiment as well, laser annealing treatment can be carried out according to the same method as the method explained in the first embodiment. Similar to the first embodiment, laser light used for the laser annealing treatment is preferably UV laser light, and the wavelength of the UV laser light is preferably 150 to 400 nm. In addition, the semiconductor device manufacturing apparatus 7 shown in FIG. 3 can be used in the same manner in this second embodiment as well. Similar to the first embodiment, at least one type of material selected from the group consisting of quartz, calcium fluoride ($CaF_2$), magnesium fluoride ($MgF_2$) and lithium fluoride (LiF) is preferably used for the material of the laser transmittable window 708 of the manufacturing apparatus 7 shown in FIG. 3.

(Lower Surface Junction Electrode Formation Step)

Next, the lower surface junction electrode formation step is carried out (Step S217). Since the lower surface junction electrode formation step is the same as the Step S117 explained in the first embodiment, a duplicate explanation thereof is omitted here.

Finally, when the semiconductor wafer is severed by dicing and the like, it can be cut apart into single semiconductor devices 9. As a result, the semiconductor device 9 shown in FIG. 5 can be obtained.

As has been described above, according to the second embodiment, the MOSFET provided with the semiconductor substrate having silicon carbide as the material thereof can be manufactured according to the manufacturing method in which the lower surface structure formation step is carried out after the upper surface structure formation step. In addition, similar to the first embodiment, the second embodiment may further include a thinning step of thinning the raw material wafer. In this case, the thinning step is preferably carried out between the surface cover film formation step (Step S211) and the lower surface electrode material layer deposition step (Step S213).

Although the above has provided a detailed explanation of examples of the present teachings, these are merely examples and are not intended to limit the scope of the claims. Various modifications and alterations of the specific examples listed above are included in the technology described in the claims.

The technical elements explained in the present description or drawings demonstrate technical usefulness either alone or by combining various types thereof, and are not limited to the combinations described in the claims at the time of filing. In addition, technologies exemplified in the present description or drawings are able to achieve multiple objects simultaneously, and the achieving of one of those objects per se has technical usefulness.

What is claimed is:

1. A method for manufacturing a semiconductor device including a semiconductor substrate composed of silicon carbide, an upper surface electrode which contacts an upper surface of the substrate, and a lower surface electrode which contacts a lower surface of the substrate, the method comprising:

(a) forming an upper surface structure on the upper surface side of the substrate, and (b) forming a lower surface structure on the lower surface side of the substrate after the (a), wherein the forming (a) comprises:

(a1) forming an interlayer insulating film on the upper surface structure on the upper surface side of the substrate, (a2) depositing an upper surface electrode material layer on the upper surface of the substrate, the upper surface electrode material layer being a raw material layer of the upper surface electrode, and (a3) annealing the upper surface electrode material layer, and the forming (b) comprises:

(b1) depositing a lower surface electrode material layer on the lower surface of the substrate, the lower surface electrode material layer being a raw material layer of the lower surface electrode, and (b2) annealing the lower surface electrode material layer with a laser to make an ohmic contact between the lower surface electrode and the substrate wherein the forming of the interlayer insulating film is formed before the depositing (a2).

2. The method according to claim 1, wherein a temperature of annealing the upper surface electrode material layer in the annealing (a3) is lower than a temperature of annealing the lower surface electrode material layer with the laser in the annealing (b2).

3. The method according to claim 2, wherein the forming (a) further comprises:

(a4) forming a surface cover film on the upper surface side of the substrate before the forming (b).

4. The method according to claim 3, wherein in the annealing (b2), the laser is an UV laser having a wavelength equal to or longer than 150 nm and equal to or shorter than 400 nm.

5. The method according to claim 4, further comprising:

(c) thinning the substrate, wherein the thinning (c) is performed between the forming (a) and the forming (b).

6. The method according to claim 5, wherein in the thinning (c), the substrate is thinned to a thickness equal to or greater than 50 μm and equal to or smaller than 250 μm.

7. The method according to claim 6, wherein the upper surface electrode primarily includes at least one metal selected from the group consisting of Ti, Al, Mo, and Ni, and the lower surface electrode primarily includes Ni.

8. The method according to claim 7, wherein in the annealing (b2), a temperature of annealing the lower surface electrode material layer with the laser is equal to or higher than 900 degrees Celsius.

9. The method according to claim 1, wherein in the annealing (b2), the laser is an UV laser having a wavelength equal to or longer than 150 nm and equal to or shorter than 400 nm.

10. The method according to claim 9, wherein a temperature of annealing the upper surface electrode material layer in the annealing (a2) is lower than a temperature of annealing the lower surface electrode material layer with the laser in the annealing (b2), and in the annealing (b2), a temperature of annealing the lower surface electrode material layer with the laser is equal to or higher than 900 degrees Celsius.

11. The method according to claim 10, wherein the upper surface electrode primarily includes at least one metal selected from the group consisting of Ti, Al, Mo, and Ni, and the lower surface electrode primarily includes Ni.

12. The method according to claim 11, further comprising:

(c) thinning the substrate to a thickness equal to or greater than 50 μm and equal to or smaller than 250 μm, wherein the thinning (c) is performed between the forming (a) and the forming (b).

13. The method according to claim 1, further comprising:

(c) thinning the substrate, wherein the thinning (c) is performed between the forming (a) and the forming (b).

14. The method according to claim 13, wherein in the thinning (c), the substrate is thinned to a thickness equal to or greater than 50 μm and equal to or smaller than 250 μm.

15. The method according to claim 14, wherein the upper surface electrode primarily includes at least one metal selected from the group consisting of Ti, Al, Mo, and Ni, the lower surface electrode primarily includes Ni, a temperature of annealing the upper surface electrode material layer in the annealing (a3) is lower than a temperature of annealing the lower surface electrode material layer with the laser in the annealing (b2), and in the annealing (b2), a temperature of annealing the lower surface electrode material layer with the laser is equal to or higher than 900 degrees Celsius.

* * * * *